United States Patent
Dumitru et al.

(10) Patent No.: US 9,660,169 B2
(45) Date of Patent: May 23, 2017

(54) SENSORS AND METHOD OF OPERATING SENSOR

(75) Inventors: Viorel G. Dumitru, Bucharest (RO); Ion Georgescu, Bucharest (RO); Stefan D. Costea, Bucharest (RO); Mihai Brezeanu, Bucharest (RO)

(73) Assignee: Honeywell International Inc., Morris Plains, NJ (US)

( * ) Notice: Subject to any disclaimer, the term of this patent is extended or adjusted under 35 U.S.C. 154(b) by 386 days.

(21) Appl. No.: 14/345,410

(22) PCT Filed: Sep. 22, 2011

(86) PCT No.: PCT/IB2011/054170
§ 371 (c)(1),
(2), (4) Date: Oct. 20, 2014

(87) PCT Pub. No.: WO2013/041911
PCT Pub. Date: Mar. 28, 2013

(65) Prior Publication Data
US 2015/0035092 A1    Feb. 5, 2015

(51) Int. Cl.
| | | |
|---|---|---|
| *H01L 29/82* | (2006.01) | |
| *H01L 41/02* | (2006.01) | |
| *G01L 9/00* | (2006.01) | |
| *G01B 7/16* | (2006.01) | |
| *G01L 1/14* | (2006.01) | |
| *G01L 1/16* | (2006.01) | |
| *G01L 1/18* | (2006.01) | |
| *G01L 1/20* | (2006.01) | |
| *G01L 1/22* | (2006.01) | |
| *H01L 49/02* | (2006.01) | |
| *H01L 29/20* | (2006.01) | |
| *H01L 29/778* | (2006.01) | |
| *H01L 33/00* | (2010.01) | |

(52) U.S. Cl.
CPC ............... *H01L 41/02* (2013.01); *G01B 7/18* (2013.01); *G01B 7/22* (2013.01); *G01L 1/146* (2013.01); *G01L 1/148* (2013.01); *G01L 1/16* (2013.01); *G01L 1/18* (2013.01); *G01L 1/205* (2013.01); *G01L 1/2293* (2013.01); *G01L 9/008* (2013.01); *G01L 9/0052* (2013.01); *G01L 9/0072* (2013.01); *G01L 9/0098* (2013.01); *H01L 28/10* (2013.01); *H01L 29/2003* (2013.01); *H01L 29/778* (2013.01); *H01L 33/00* (2013.01)

(58) Field of Classification Search
CPC .................................. H01L 29/66462
See application file for complete search history.

(56) References Cited

U.S. PATENT DOCUMENTS 6,606,911 B2 * 8/2003 Akiyama .............. G01L 9/0072
324/663

* cited by examiner

*Primary Examiner* — Samuel Gebremariam
(74) *Attorney, Agent, or Firm* — Brooks, Cameron & Huebsch, PLLC

(57) ABSTRACT

Sensors and methods of operating sensors are described herein. One sensor includes a number of III-nitride strain sensitive devices and a number of passive electrical components that connects each of them to one of the III-nitride strain sensitive devices.

10 Claims, 6 Drawing Sheets

SENSORS AND METHOD OF OPERATING SENSOR

TECHNICAL FIELD

The present disclosure relates to sensors and methods of operating sensors.

BACKGROUND

Sensors are used for measuring quantities and/or converting the measured quantities into a signal which can be read by an observer and/or an instrument. Sensors may operate in high temperatures and/or other harsh environments, such as, for example, industrial equipment, rotor shafts, rolling bearings, helicopter blades, and/or wind turbine blades, etc.

Due to the varying environments in which measurements are taken, a number of different types of sensors have been developed, such as, for example, passive sensors and contactless sensors. Passive sensors may not have a power source to emit a signal, but rather passively accept incoming signals. Contactless sensors may wirelessly transmit the acquired data, therefore not being connected through a wire to a central monitoring station.

Sensors are typically called upon to exhibit a relatively high sensitivity over a large area of measure while maintaining a low cost of manufacture. The sensitivity and cost of manufacture of a sensor may depend upon the type of material and upon the method of fabrication used to manufacture the sensor, for example.

Some previous sensors may be able to operate in high temperatures and/or other harsh environments. However, such previous sensors had low sensitivity and/or a prohibitively high cost of manufacture due, in part, to the method of fabrication used to manufacture the sensors. That is, such previous sensors did not provide an adequate degree of measurement sensitivity and/or were prohibitively expensive to manufacture.

DETAILED DESCRIPTION

Figure 1:
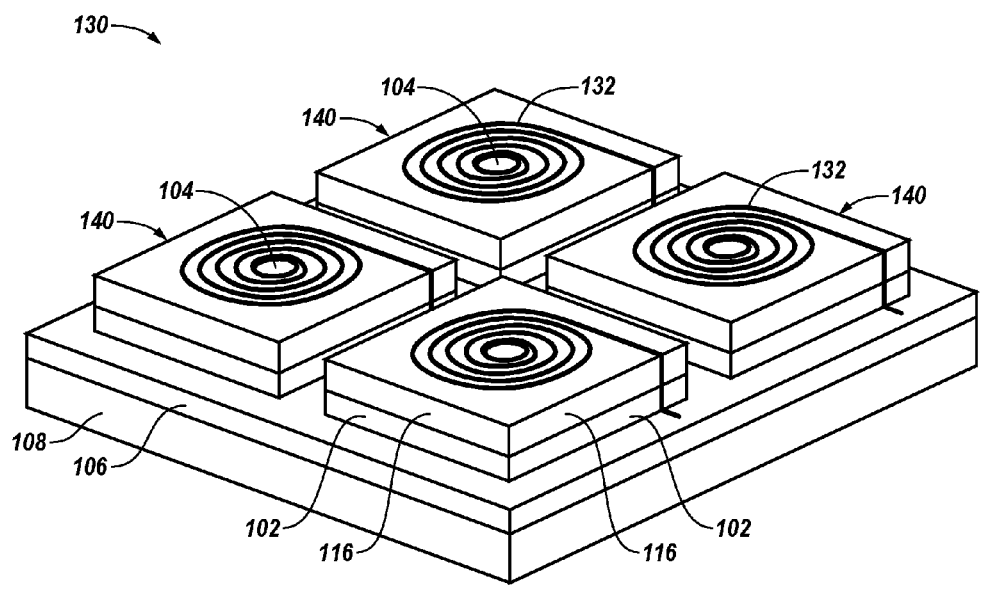
FIG. 1 illustrates a sensor in accordance with one or more embodiments of the present disclosure.

Sensor and methods of operating sensors are described herein. For example, one or more embodiments include a sensor, comprising a number of III-nitride strain sensitive devices, and a number of passive electrical components that connects each of them to one of the III-nitride strain sensitive devices.

Sensors in accordance with one or more embodiments of the present disclosure can monitor strain, vibrations, pressure, and/or acceleration using III-nitride devices, as strain sensitive devices. Such sensors can utilize, for example, commercially available GaN based devices, consequently lowering the manufacturing cost of the sensors. Further, the GaN based devices can have high thermal stability due to the wide-band gap nature of the material, which can allow for the strain sensitive devices to operate in high temperature environments. Further, GaN is chemically stable, which can allow the strain sensitive devices to operate in chemically harsh environments.

As such, sensors in accordance with one or more embodiments of the present disclosure can have increased measurement sensitivity in harsh environments compared to previous sensors. That is, sensors in accordance with one or more embodiments of the present disclosure exhibit an increased sensitivity compared to previous sensors due to the use of sensitive III-nitride based strain sensitive devices.

Sensors in accordance with one or more embodiments of the present disclosure can utilize changes in the capacitance of III-nitride strain sensitive devices caused by a piezoelectric generated charge. Accordingly, the resonant frequency of the sensors can change also. The change in resonant frequency can be interrogated with an external reader. The interrogated change can be converted for use by an observer and/or an instrument. In one or more embodiments, the resonant frequency change can be converted to a reading such as strain, vibration, pressure, acceleration, and/or combinations thereof.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 106 may reference element "06" in FIG. 1, and a similar element may be referenced as 406 in FIG. 4A.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

As used herein, "a" or "a number of" something can refer to one or more such things. For example, "a number of sensor devices" can refer to one or more sensor device.

FIG. 1 illustrates a strain sensor 130 in accordance with one or more embodiments of the present disclosure. Sensor 130 can be, for example, a passive and/or contactless sensor. A passive sensor may not have a power source to emit a signal, but rather passively accepts incoming signals. A contactless sensor may wirelessly transmit the acquired data, thus not being connected through a wire to a central monitoring station.

As shown in FIG. 1, sensor 130 includes a number of III-nitride strain sensitive devices 140. An III-nitride strain sensitive device can include a strain sensitive device that has an III-nitride material, as will be further described in connection with FIGS. 2A-5B. A strain sensitive device can include a device used to measure a strain applied to an object. For example, a strain sensor can utilize capacitance of a structure to measure stress. In some embodiments, strain sensitive devices 140 can include one of: a Schottky diode, a metal-isolator-semiconductor (MIS) structure, and an MIS heterostructure. In some embodiments, the III-nitride strain sensitive device can include one of: a P-N diode, a PIN diode, a light emitting diode (LED), and a laser diode. The III-nitride strain sensitive devices 140 illustrated in FIG. 1 are metal-isolator-semiconductor (MIS) structures, as will be further described in connection in FIGS. 3A-3B. For example, the III-nitride strain sensitive MIS structure can include a Schottky contact 104, an ohmic contact 106, an III-nitride material 102, an isolator substrate 108, and an isolator material 116, as illustrated in FIG. 1. A number of III-nitride strain sensitive devices in accordance with one or more embodiments of the present disclosure will be further described herein.

As shown in FIG. 1, sensor 130 includes a passive electrical component 132 that connects the number of III-nitride strain sensitive devices 140. A passive electrical component can include an electronic element that may be available in a discrete form having two or more electrical terminals that may not introduce net energy into a circuit in which it is connected. In the embodiment illustrated in FIG. 1, the passive electrical component 132 is an inductor coil 132, but embodiments are not so limited. An inductor coil can, for example, include any material that can store energy in a magnetic field. Although not so limited, the inductor coil can be wound as illustrated in FIG. 1.

Embodiments in which the number of III-nitride strain sensitive devices are connected with an inductor coil can include forming an inductance-capacitance resonant circuit having the capacitance of the strain sensing device. A resonant circuit can include, for example, an inductor connected to a capacitor that can act as an electrical resonator storing electrical energy oscillating at the resonant frequency of the circuit.

In some embodiments, the passive electrical component can include an antenna (not shown in FIG. 1), such as, for example, a tunable antenna. Embodiments in which the number of III-nitride strain sensitive devices are connected with an antenna can, for example, form a sensor having an electrical equivalence circuit of an inductance-capacitance resonant circuit with the capacitance of the III-nitride strain sensitive device.

In some embodiments, the passive electrical component 132 can be on-chip integrated. An on-chip integrated passive electrical component can include, for example, an inductor coil or an antenna manufactured by standard photolithographic and metallization techniques, by printed electronics technologies or any other suitable known method.

In some embodiments, a number of passive contactless inductance-capacitance sensors can be arranged in an array to form a large area sensor. Large area sensors can, for example, be used where a measurement is needed over more than a discrete location.

In some embodiments, sensor 130 can be formed on a flexible foil. A flexible foil can include a metallic foil, for example. As an example, a polycrystalline, highly c-axis oriented InN or AlInN semiconductor material can be deposited via sputtering over a large area flexible foil.

In some embodiments, sensor 130 can be interrogated by an external reader. An external reader can include, but is not limited to, a radio frequency identification (RFID) reader. Interrogation can, for example, include backscattering and/or inductive coupling, as described in connection with respect to FIG. 6. For example, interrogation can include gathering strain measurements from the number of III-nitride strain sensitive devices of the sensor.

In some embodiments according to the present disclosure, measurements include changes in the capacitance of the III-nitride strain sensitive devices caused by a piezoelectric generated charge. Accordingly, the resonant frequency of the sensors can change also. The change in resonant frequency can be interrogated by an external reader.

Figure 2A:
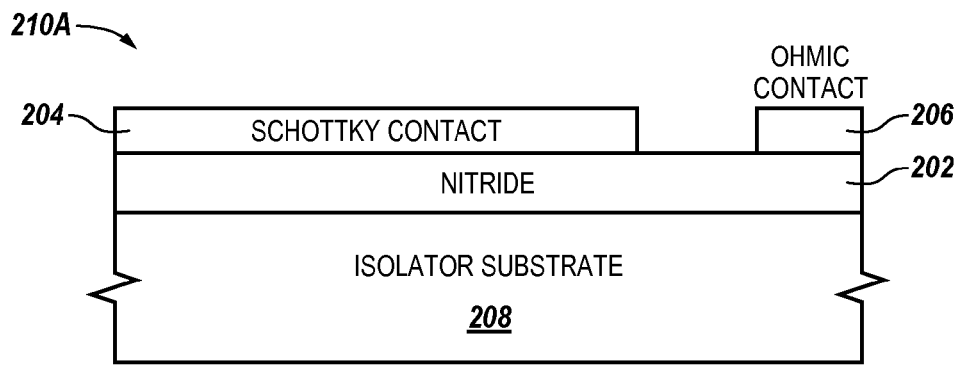
FIG. 2A illustrates a strain sensitive device in accordance with one or more embodiments of the present disclosure.

FIG. 2A illustrates a strain sensitive device 210a in accordance with one or more embodiments of the present disclosure. Strain sensitive device 210a is a Schottky diode. As shown in FIG. 2A, strain sensitive device 210a includes a Schottky contact 204, an ohmic contact 206, an III-nitride material 202, and an isolator substrate 208.

A Schottky contact is a region on a semiconductor device that has been prepared so that the current-voltage curve of the device is non-linear and asymmetric. For example, a Schottky contact on n-type nitride semiconductors can include a metallization scheme including, but not limited to, Ni/Au, Pt/Au, Pd/Au, and/or combinations thereof. A Schottky contact on p-type nitride semiconductors can include a metallization scheme including, but not limited to Ti/Al/Au, Ti/Al/Ti/Au, Ti/Al/Ni/Au, and/or combinations thereof.

An ohmic contact is a region on a semiconductor device that has been prepared so that the current-voltage curve of the device is linear and symmetric. For example, an ohmic contact on n-type nitride semiconductors can include a metallization scheme including, but not limited to, Ti/Al/Au, Ti/Al/Ti/Au, Ti/Al/Ni/Au, and/or combinations thereof. An ohmic contact on p-type nitride semiconductors can include a metallization scheme including, but not limited to, Ni/Au, Pd/Au, Pt/Au and/or combinations thereof.

An III-nitride material includes materials from Group 13 (e.g., Boron Group) of the periodic table bonded with Nitrogen. The III-nitride material can include, but is not limited to, AlN, GaN, InN, InGaN, AlGaN, AlInN, AlGaInN. An isolator substrate can include, but is not limited to, sapphire, Silicon, Kapton, PET or ceramic substrates. In one or more embodiments, the isolator substrate can be a material used in the art for epitaxial growing of GaN based devices.

Figure 2B:
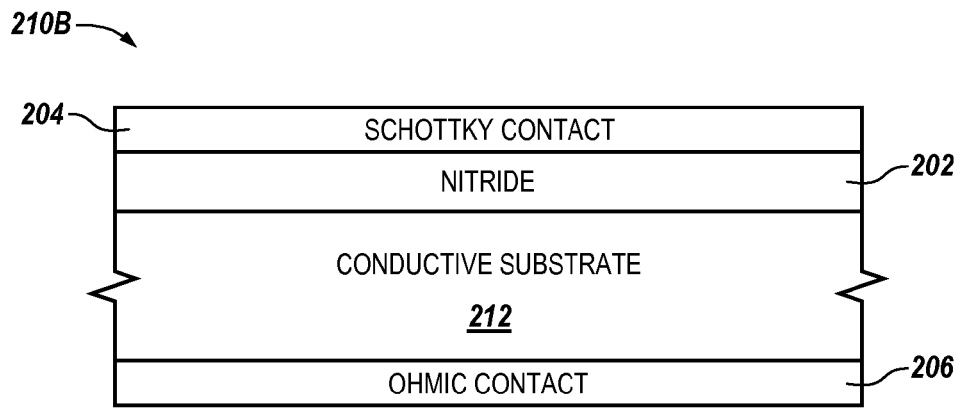
FIG. 2B illustrates a strain sensitive device in accordance with one or more embodiments of the present disclosure.

FIG. 2B illustrates a strain sensitive device 210b in accordance with one or more embodiments of the present disclosure. Strain sensitive device 210b is a Schottky diode. As shown in FIG. 2B, strain sensitive device 210b includes a conductive substrate 212. A conductive substrate can include, but is not limited to, SiC, Silicon, metal foils. In one or more embodiments, the conductor substrate can be a material used in the art for epitaxial growing of GaN based devices.

As shown in FIG. 2B, strain sensitive device 210b includes a Schottky contact 204, an ohmic contact 206, and an III-nitride material 202. Schottky contact 204, ohmic contact 206, and III-nitride layer 202 in FIG. 2B can be analogous to Schottky contact 204, an ohmic contact 206, and III-nitride material 202, respectively, previously described in connection with FIG. 2A.

Figure 3A:
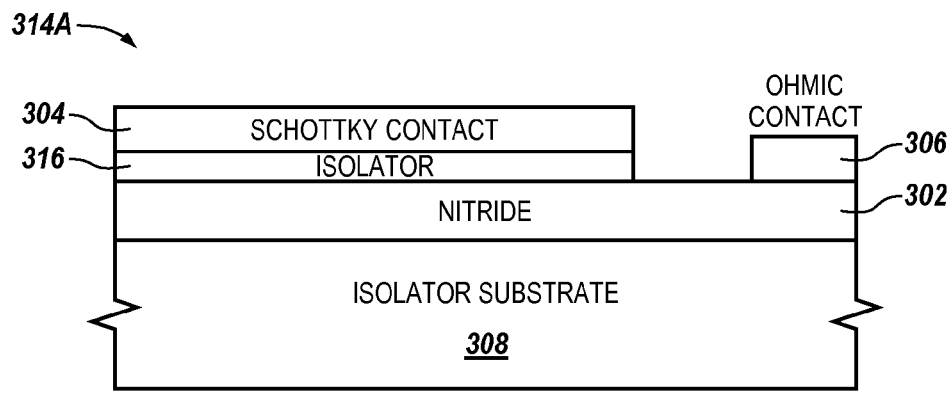
FIG. 3A illustrates a strain sensitive device in accordance with one or more embodiments of the present disclosure.

FIG. 3A illustrates a strain sensitive device 314a in accordance with one or more embodiments of the present disclosure. Strain sensitive device 314a is a metal-isolator-semiconductor (MIS) structure. As shown in FIG. 3A, strain sensitive device 314a includes an isolator material 316. An isolator can include an isolator material known in the art including, but not limited to, AlN, Al2O3, SiO2, etc., and/or combinations thereof. An MIS structure according to the present disclosure can include, but is not limited to, standard MIS schemes.

As shown in FIG. 3A, strain sensitive device 314a includes a Schottky contact 304, an ohmic contact 306, an III-nitride material 302, and an isolator substrate 308. Schottky contact 304, ohmic contact 306, and III-nitride layer 302 in FIG. 3A can be analogous to Schottky contact 204, ohmic contact 206, and III-nitride material 202, respectively, previously described in connection with FIG. 2A.

Figure 3B:
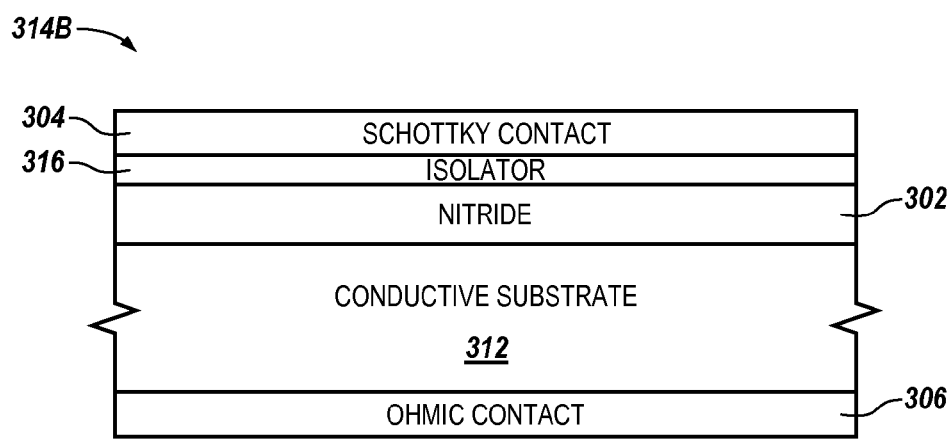
FIG. 3B illustrates a strain sensitive device in accordance with one or more embodiments of the present disclosure.

FIG. 3B illustrates a strain sensitive device 314b in accordance with one or more embodiments of the present disclosure. Strain sensitive device 314b is an MIS structure. Schottky contact 304, ohmic contact 306, an III-nitride material 302, and conductive substrate 312 in FIG. 3B can be analogous to Schottky contact 204, ohmic contact 206, III-nitride material 202, and conductive substrate 212, respectively, previously described in connection with FIG. 2B. Isolator material 316 in FIG. 3B can be analogous to isolator material 316 previously described in connection with FIG. 3A.

Figure 4A:
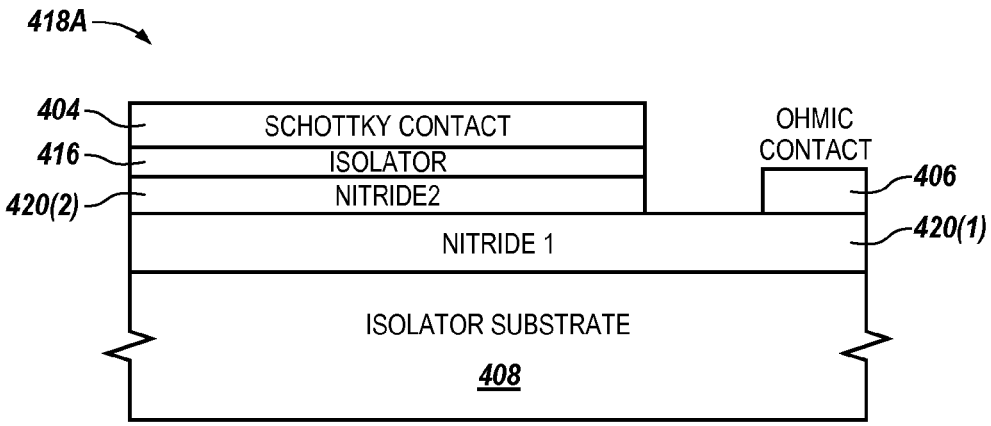
FIG. 4A illustrates a strain sensitive device in accordance with one or more embodiments of the present disclosure.

FIG. 4A illustrates a strain sensitive device 418a in accordance with one or more embodiments of the present disclosure. Strain sensitive device 418a is an MIS heterostructure. As shown in FIG. 4A, strain sensitive device 418a includes a Schottky contact 404, an ohmic contact 406, III-nitride material 420(1), III-nitride material 420(2), an isolator substrate 408, and an isolator material 416.

In some embodiments according to the present disclosure, the III-nitride materials 420(1), 420(2) can include, but are not limited to, material pairs such as GaN/AlGaN, InGaN/GaN, InGaN/AlGaN, AlInGaN/AlN, AlInN/GaN, and/or generally AlInGaN/AlInGaN pairs where the two nitride materials have different band gaps. A band gap is an energy range in a solid where no electron states can exist.

An MIS heterostructure is a device in which a heterojunction exists. A heterojunction is an interface that occurs between two materials of dissimilar semiconductors, for example III-nitride materials 420(1), 420(2). Schottky contact 404, ohmic contact 406, isolator material 416 and isolator substrate 408 in FIG. 4A can be analogous to Schottky contact 304, ohmic contact 306, isolator material 316, and isolator substrate 308, respectively, previously described in connection with FIG. 3A.

Figure 4B:
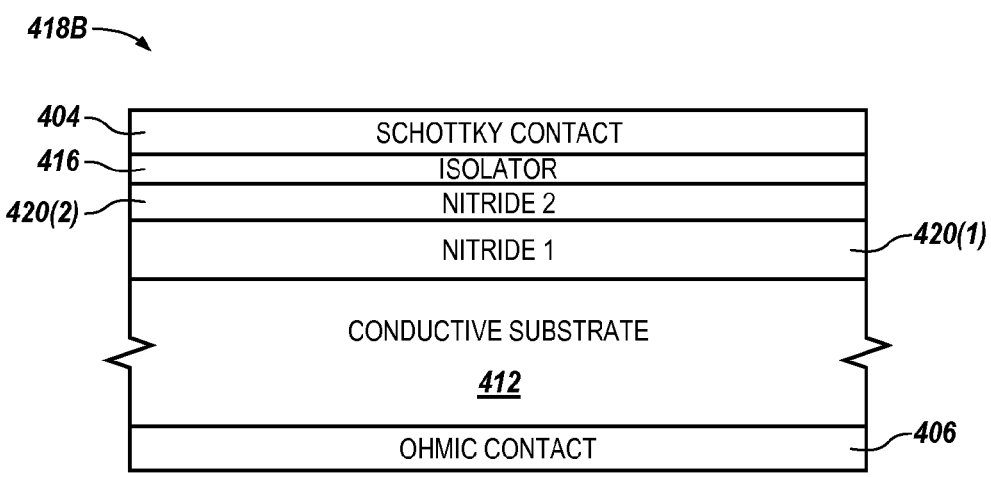
FIG. 4B illustrates a strain sensitive device in accordance with one or more embodiments of the present disclosure.

FIG. 4B illustrates a strain sensitive device 418b in accordance with one or more embodiments of the present disclosure. Strain sensitive device 418b is an MIS heterostructure. Schottky contact 404, ohmic contact 406, III-nitride material 420(1), III-nitride material 420(2), and isolator material 416 in FIG. 4B can be analogous to Schottky contact 404, ohmic contact 406, III-nitride material 420(1), III-nitride material 420(2), and isolator material 416, respectively, previously described in connection with FIG. 4A. Conductive substrate 412 in FIG. 4B can be analogous to conductive substrate 212, previously described in connection with FIG. 2B.

Figure 5A:
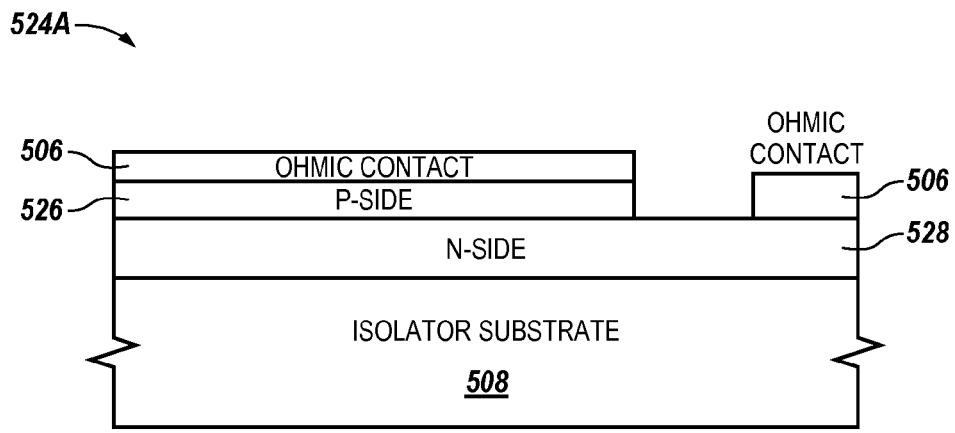
FIG. 5A illustrates a strain sensitive device in accordance with one or more embodiments of the present disclosure.

FIG. 5A illustrates a strain sensitive device 524a in accordance with one or more embodiments of the present disclosure. Strain sensitive device 524a is a P-N diode. As shown in FIG. 5A, strain sensitive device 524a includes two ohmic contacts 506, an isolator substrate 508, a P-type semiconductor 526, and an N-type semiconductor 528.

A P-N diode can include a P-type semiconductor 526 and an N-type semiconductor 528 which form a P-N junction. A P-type semiconductor can be obtained by carrying out a process of doping: that is, adding a certain type of atoms to the semiconductor in order to increase the number of free charge carriers. In some embodiments, the P-type semiconductor can include an III-nitride material as described herein.

An N-type semiconductor can include an extrinsic semiconductor in which the dopant atoms are capable of providing extra conduction electrons to the host to create an excess of negative electron charge carriers. In some embodiments, the N-type semiconductor can include an III-nitride material as described herein.

Ohmic contacts 506 and isolator substrate 508 in FIG. 5A can be analogous to ohmic contact 206 and isolator substrate 208, respectively, previously described in connection with FIG. 2A.

Figure 5B:
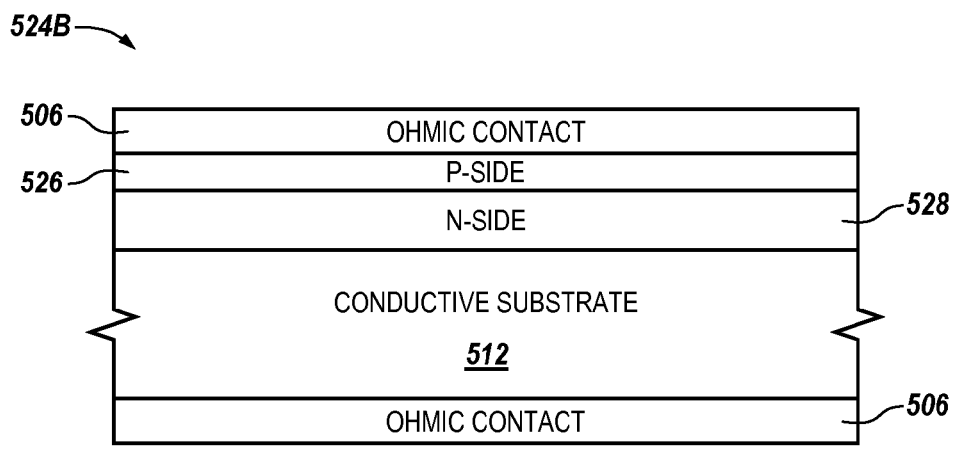
FIG. 5B illustrates a strain sensitive device in accordance with one or more embodiments of the present disclosure.

FIG. 5B illustrates a strain sensitive device 524b in accordance with one or more embodiments of the present disclosure. Strain sensitive device 524b is a P-N diode. As shown in FIG. 5B, strain sensitive device 524b illustrates two ohmic contacts 506, a conductive substrate 512, a P-type semiconductor 526, and an N-type semiconductor 528. Ohmic contacts 506, P-type semiconductor 526, and N-type semiconductor 528 in FIG. 5B can be analogous to ohmic contacts 506, P-type semiconductor 526, and N-type semiconductor 528, respectively, previously described in connection with FIG. 5A. Conductive substrate 512 in FIG. 5B can be analogous to conductive substrate 212, previously described in connection with FIG. 2B.

In some embodiments of the present disclosure, an III-nitride strain sensitive device in accordance with one or more embodiments of the present disclosure can include a PIN diode. A PIN diode can include, for example, a three-material semiconductor diode in which an intrinsic material separates heavily doped P and N materials. Further embodiments can include, but are not limited to, a light-emitting diode (LED). In one or more embodiments of the present disclosure, a strain sensitive device can include a laser diode.

In some embodiments of the present disclosure, a sensor in accordance with one or more embodiments of the present disclosure can include a reference cavity. A reference cavity can, for example, be a cavity within the sensor which is at a known pressure that can be used to aid in measuring environmental pressure relative to the known pressure within the cavity. Such embodiments that include a reference cavity can, for example, measure pressure.

In some embodiments, a sensor in accordance with one or more embodiments of the present disclosure can measure acceleration. Such embodiments can include placing the passive contactless inductance-capacitance sensor on a cantilever beam, where the cantilever beam includes a sensitive mass. A sensitive mass can include a seismic mass in which acceleration acts upon. In one or more embodiments according to the present disclosure, the sensitive mass can alternatively be restrained by a spring.

Figure 6:
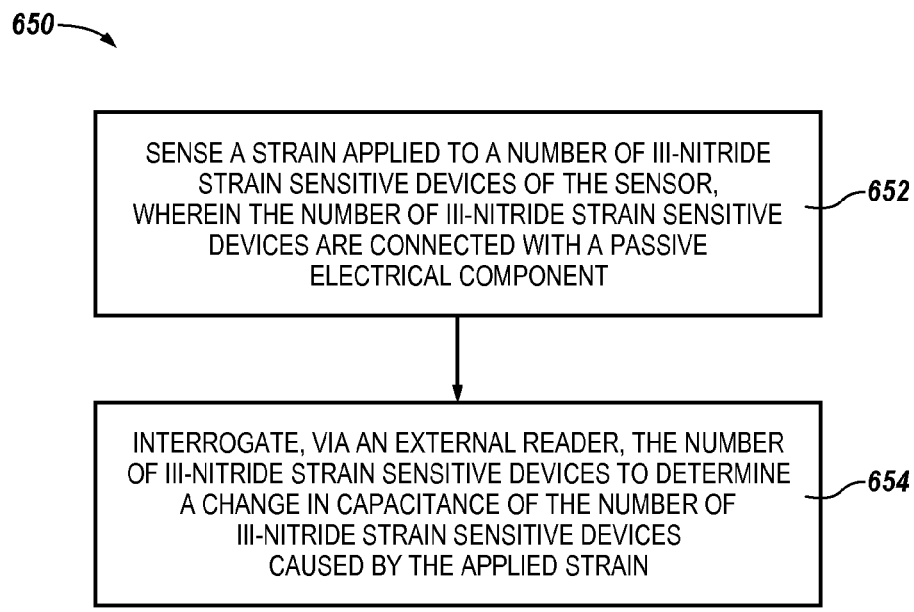
FIG. 6 illustrates a method of operating a sensor in accordance with one or more embodiments of the present disclosure.

FIG. 6 illustrates a method 650 in accordance with one or more embodiments of the present disclosure. A strain applied to a number of III-nitride strain sensitive devices of the sensor, wherein the number of III-nitride strain sensitive devices are connected with a passive electrical component, is sensed at 652. The sensor can, for example, be passive and/or contactless. In some embodiments of the present disclosure, the number of III-nitride stain sensitive devices can include a strain sensitive device as described in connection with FIGS. 2A-5B.

In some embodiments according to the present disclosure, the strain sensed at 652 can include strains resulting from, such as, for example, vibrations, pressure, and/or acceleration.

An external reader interrogates the number of III-nitride strain sensitive devices to determine a change in capacitance of the number of III-nitride strain sensitive devices caused by the applied strain at 654. In some embodiments, an external reader can include an active reader, such as, for example, a continuous wave reader, a reader coil, etc., and/or combinations thereof.

In some embodiments according to the present disclosure, an external reader can interrogate via inductive coupling where the passive electrical component is an inductive coil. For example, an inductive coil external reader can be placed in proximity to the inductive coil of the sensor so that current flow through the external reader induces a voltage across the inductive coil of the sensor through electromagnetic induction. The amount of inductive coupling between the external reader and the inductive coil of the sensor can be used to determine the strain applied to the number of III-nitride strain sensitive devices of the sensor.

In some embodiments according to the present disclosure, an external reader can interrogate using backscattering electromagnetic waves and an antenna, when the passive electrical component is an antenna. For example, an external reader antenna can send waves to the sensor and can receive reflected waves off the sensor that carry a measurement of the strain applied to the number of III-nitride strain sensing devices of the sensor.

Embodiments of the present disclosure provide sensors and methods of operating sensors. Embodiments can be arranged as an array in order to monitor strain or vibrations on large area surfaces. For example, an array of sensors can be used to gather information about an environment.

Further, embodiments of the present disclosure can provide passive contactless inductance-capacitance sensors with increased sensitivity compared to prior sensors. In one or more embodiments, large area sensors can be manufactured by low cost methods and/or operate in harsh condition environments.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A strain sensitive diode, comprising:
a number of group III-nitride strain sensitive diode devices; and
a number of passive electrical components, wherein each one of the passive electrical components is connected to a different one of the number of group III-nitride strain sensitive diode devices.

2. The strain sensitive diode of claim 1, wherein the strain sensitive diode is a passive contactless sensor.

3. The strain sensitive diode of claim 1, wherein the passive electrical component is an inductor coil.

4. The strain sensitive diode of claim 1, wherein the passive electrical component includes an antenna.

5. The strain sensitive diode of claim 1, wherein the passive electrical components are on-chip integrated.

6. The strain sensitive diode of claim 1, wherein the number of group III-nitride strain sensitive diode devices is constructed at least in part from at least one material selected from the group of materials including: GaN, AlN, InN, and their ternary and quaternary alloys.

7. The strain sensitive diode of claim 1, wherein the number of group III-nitride strain sensitive diode devices includes one of: a Schottky diode, a metal-isolator-semiconductor (MIS) structure, and an MIS heterostructure.

8. The strain sensitive diode of claim 1, wherein the number of group III-nitride strain sensitive diode devices includes one of: a P-N diode, a PIN diode, a light-emitting diode (LED), and a laser diode.

9. The strain sensitive diode of claim 1, wherein the number of group III-nitride strain sensitive diode devices are formed on a flexible foil.

10. The strain sensitive diode of claim 1, wherein the strain sensitive diode includes a reference cavity for use in measuring pressure.

* * * * *